United States Patent
Kargl et al.

(10) Patent No.: US 10,158,349 B2
(45) Date of Patent: Dec. 18, 2018

(54) ELECTRONIC CIRCUIT AND METHOD FOR TRANSFERRING DATA

(71) Applicant: Infineon Technologies AG, Neubiberg (DE)

(72) Inventors: Walter Kargl, Graz (AT); Helmut Koroschetz, Lieboch (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/466,913

(22) Filed: Mar. 23, 2017

(65) Prior Publication Data

US 2017/0310310 A1 Oct. 26, 2017

(30) Foreign Application Priority Data

Apr. 26, 2016 (DE) .......... 10 2016 107 734

(51) Int. Cl.
*H03K 3/037* (2006.01)
*H03K 3/66* (2006.01)

(52) U.S. Cl.
CPC ............ *H03K 3/66* (2013.01); *H03K 3/0372* (2013.01); *H03K 3/0375* (2013.01)

(58) Field of Classification Search
CPC ....... H03K 3/0372; H03K 3/0375; H03K 3/66
USPC .................................................. 327/199, 202
See application file for complete search history.

(56) References Cited

U.S. PATENT DOCUMENTS

| | | | | |
|---|---|---|---|---|
| 5,548,620 | A * | 8/1996 | Rogers | G06F 1/12 327/145 |
| 7,707,448 | B1 * | 4/2010 | Kim | G06F 1/12 713/400 |
| 9,197,397 | B1 * | 11/2015 | Ono | H04L 7/0045 |
| 2005/0086019 | A1 * | 4/2005 | Yeh | G01R 31/31725 702/117 |
| 2007/0177698 | A1 * | 8/2007 | Pawar | H04L 7/00 375/354 |
| 2016/0049926 | A1 * | 2/2016 | Zhang | H03K 3/0375 327/225 |

* cited by examiner

*Primary Examiner* — William Hernandez
(74) *Attorney, Agent, or Firm* — Viering, Jentschura & Partner (57) ABSTRACT

According to one embodiment, an electronic circuit is described comprising an output circuit configured to output data elements, an input circuit configured to receive the data elements from the output circuit wherein the input circuit is clocked by a clock signal and receives the data elements in accordance with its clocking, a signaling circuit configured to, when the output circuit switches from the output of one data element to the output of a following data element, signal to interrupt the clocking of the input circuit and a controller configured to interrupt the clocking of the input circuit in response to the signaling.

21 Claims, 9 Drawing Sheets

FIG 9

ELECTRONIC CIRCUIT AND METHOD FOR TRANSFERRING DATA

CROSS-REFERENCE TO RELATED APPLICATION

This application claims priority to German Patent Application Serial No. 10 2016 107 734.8, which was filed Apr. 26, 2016, and is incorporated herein by reference in its entirety.

TECHNICAL FIELD

The present disclosure relates to electronic circuits and methods for transferring data.

BACKGROUND

Information transfer in digital logic may happen either between logic located in the same clock domain, or between different clock domain regions. Whenever a transfer happens within the same clock domain, the correctness of the information transfer can be guaranteed by specific digital design tools (synthesis, static timing analysis, etc.). However, for an information transfer between different clock domains, the data correctness can typically not be guaranteed by the tools due to physical phenomenon of metastability which cannot be avoided because the data created in source clock domain can change at any moment relative to destination clock domain. In those cases the data correctness has to be guaranteed by digital design methods. Thus, efficient approaches that allow guaranteeing data correctness for data transfers over clock domain boundaries are desirable.

SUMMARY

According to one embodiment, an electronic circuit is provided including an output circuit configured to output data elements, an input circuit configured to receive the data elements from the output circuit wherein the input circuit is clocked by a clock signal and receives the data elements in accordance with its clocking, a signaling circuit configured to, when the output circuit switches from the output of one data element to the output of a following data element, signal to interrupt the clocking of the input circuit and a controller configured to interrupt the clocking of the input circuit in response to the signaling.

According to another embodiment, a method for transferring data according to the electronic circuit described above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
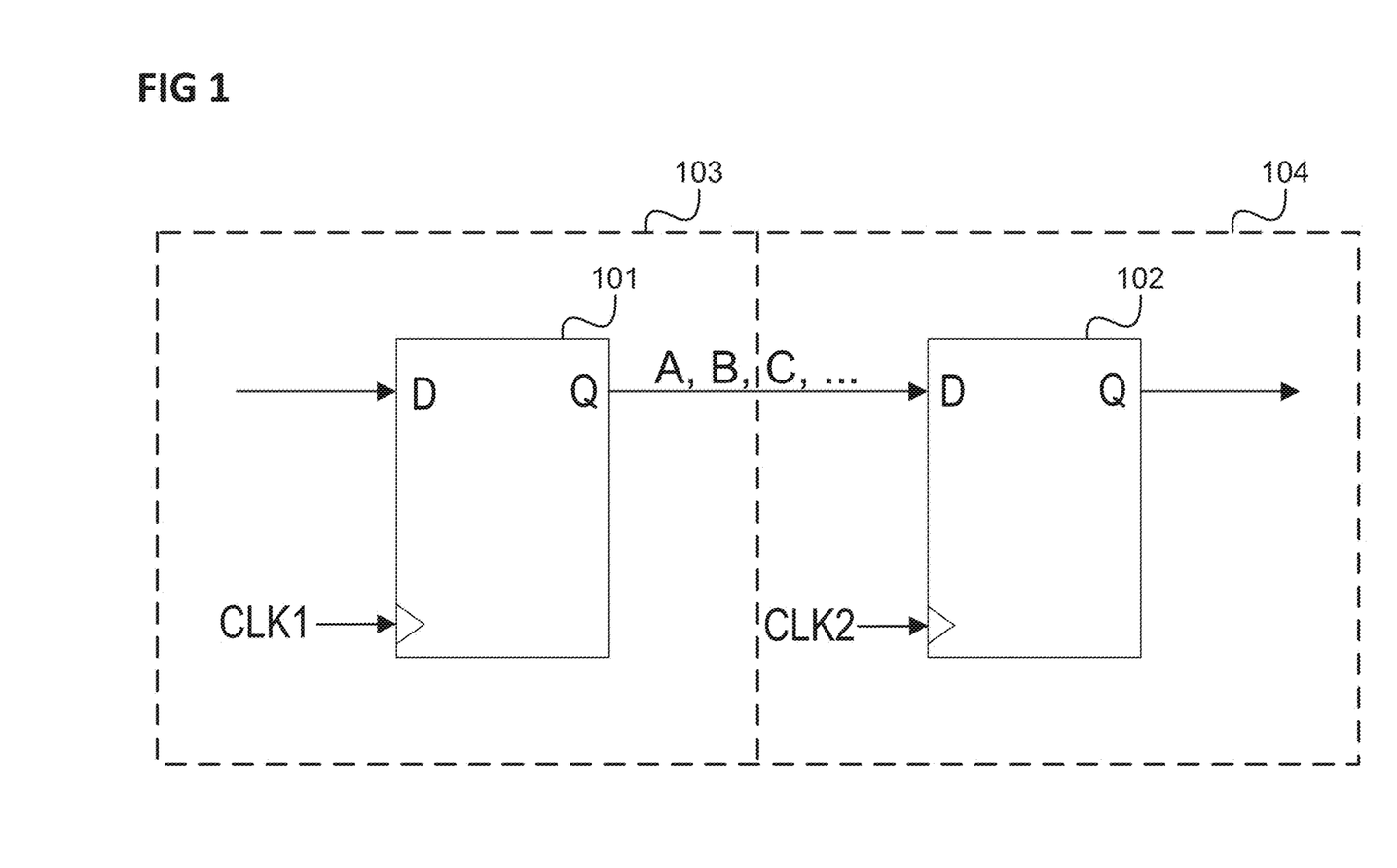
FIG. 1 illustrates a clock domain crossing.

A clock domain crossing typically occurs whenever data is transferred from a flip-flop driven by one clock to a flip-flop driven by another clock as illustrated by FIG. 1.

FIG. 1 illustrates a clock domain crossing.

In the arrangement shown in FIG. 1, the Q output of a first flip-flop 101 is connected to the D input of a second flip-flop 102. The first flip-flop 101 is part of a first clock domain 103 (e.g. of a chip, e.g. a chip card module) and is supplied with a first clock signal CLK1. The second flip-flop 102 is part of a second clock domain 104 (e.g. of the chip) and is supplied with a second clock signal CLK2.

In example of FIG. 1, data elements A, B, C . . . (e.g. bits) are output by the CLK1 clock domain 103 (output by the first flip-flop 101) and need to be captured properly by the CLK2 clock domain 104 (i.e. by the second flip-flop 102). Depending on the relationship between the two clocks CLK1 and CLK2, there could be different types of issues in transferring data from the source clock domain 103 to the destination clock domain 104 such as data sampling violation caused by metastability (i.e. instable data) or sampling of wrong (changing) data which is illustrated in FIG. 2.

Figure 2:
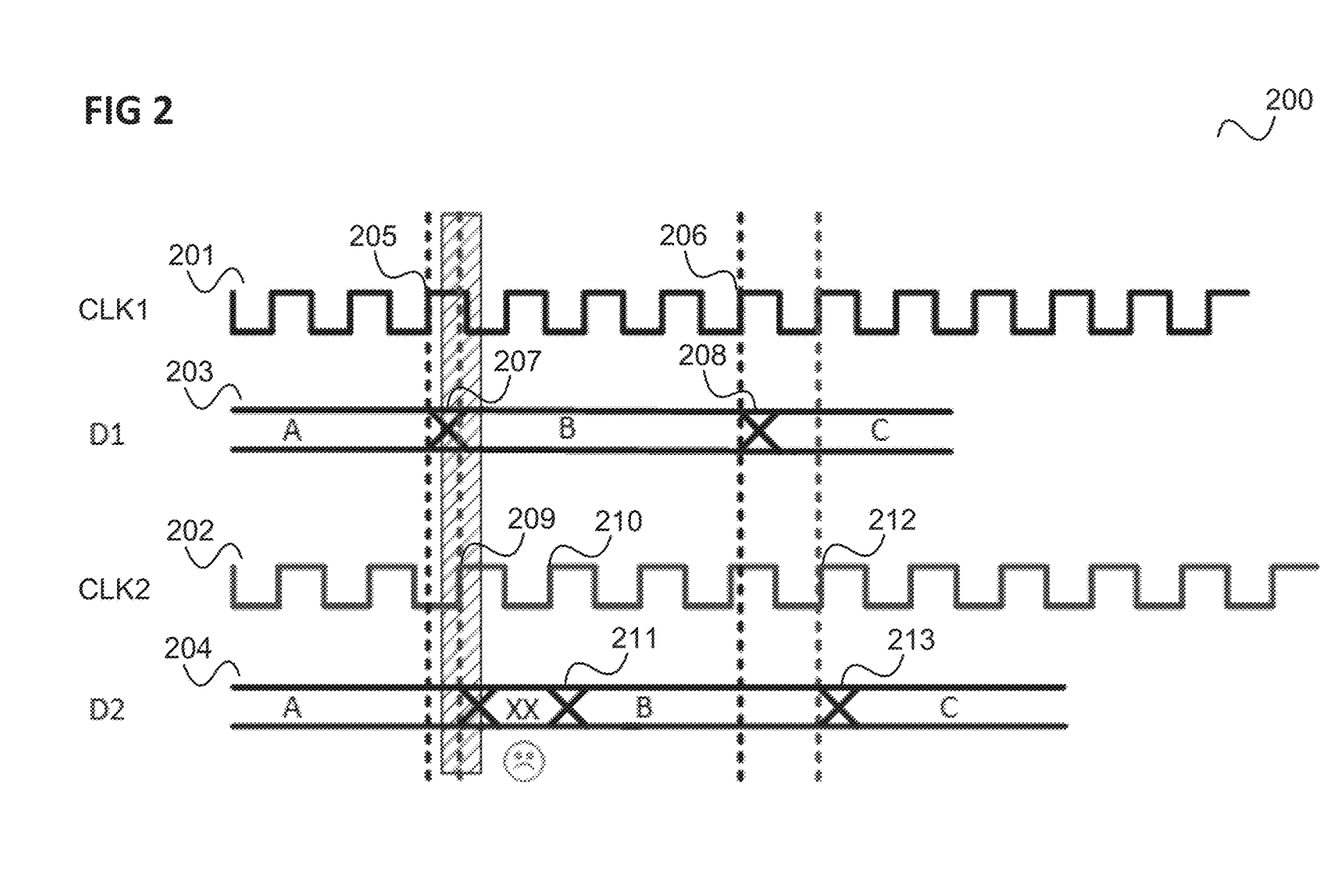
FIG. 2 shows a signal diagram for the example of FIG. 1.

FIG. 2 shows a signal diagram 200 illustrating a first clock signal CLK1 201, for example corresponding to the first clock signal CLK1 of the first clock domain 103 of FIG. 1, a second clock signal CLK2 202, for example corresponding to the second clock signal CLK2 of the second clock domain 103 of FIG. 1, first data 203 as provided by the first clock domain 103 and second data 204 as captured by the second clock domain 104.

In this example, the first clock domain 103 provides a first data element (e.g. a bit) A, until a first rising clock edge 205 of the first clock CLK1, then switches to providing a second data element B until a second rising clock edge 206 of the first clock CLK1 and then switches to providing a third data element C.

The switching from data element A to data element B takes a certain first switching time interval 207 marked by an X, i.e., only after the first switching time interval 207 has passed the data element B is stably provided at the output of the first clock domain 103, i.e. at the interface from the first clock domain 103 to the second clock domain 104, i.e. at the output of the first flip-flop 101. Similarly, only after a second switching time interval 208 marked with an X the data element C is stably provided at the output of the first clock domain 103.

During the switching time intervals 207, 208 the output of the first clock domain 103 is in a metastable state which, if there is a unfavorable relation between the first clock CLK1 and the second clock CLK2, may lead to a state in which the second clock domain 104 receives data in metastable state (i.e. unknown, random or incorrect state, e.g. an incorrect bit value) from the first clock domain 103.

For example, as illustrated in FIG. 2, if the second clock domain reads out (i.e. samples) the data element provided at the output of the first clock domain at a first clock edge 209 of the second clock CLK2 which falls within the first switching time interval 207, the second clock domain may read out a wrong value as indicated by "xx" in FIG. 2. Only after reading out the data element provided at the output of the first clock domain again at a second clock edge 210 of the second clock CLK2 (and a corresponding third switching interval 211) the second clock domain 104 correctly adopts the data element B provided by the first clock domain. However, the wrong value xx may in the meantime lead to errors in the second clock domain 104.

The metastable state at the output of the first clock domain 103 does not necessarily have to lead to the situation that the second clock domain 104 reads out a wrong value. For example, the second clock domain 104 may sample the output of the first clock domain 103 at a third rising edge 212 of the second clock when the second switching time interval 208 has already passed such that the second clock domain can correctly sample the data element C (which it stably has adopted after a corresponding fourth switching time interval 213).

In summary, when synchronizing a signal into a synchronous digital system (in this example the second clock domain 104), metastability of the signal as it occurs during the switching time intervals 207, 208 of the first clock domain (which may also be an analog domain) may corrupt data at the receiver (in this case the second clock domain). Similarly, metastability or different propagation delays of bus signals may corrupt bus data.

An approach to prevent reception of corrupt data at a receiver due to metastability is to introduce a synchronization flip-flop which basically consists of two or more standard flip-flops arranged as a shift register (SR) to get rid of the meta stable state.

For a bus system a handshake system using start end ready states may be implemented. Additionally, wait states may be introduced to avoid sampling at critical signal change states. Handshaking signals may be synchronized by a synchronization flip-flop or their synchronization may be guaranteed by design. The usage of a handshaking signal is in the following explained with reference to a chip card.

Figure 3:
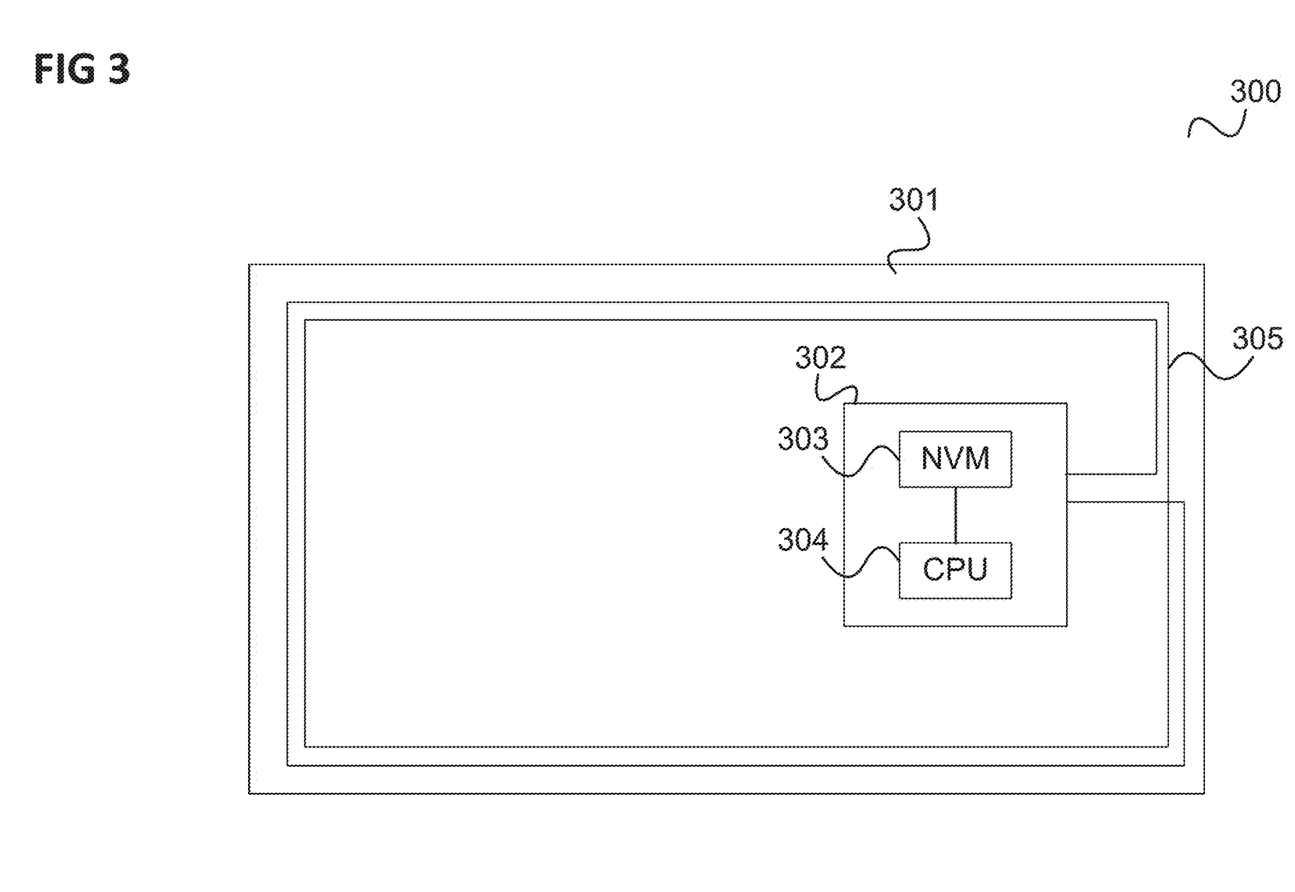
FIG. 3 shows a chip card.

FIG. 3 shows a chip card 300.

The chip card 300 includes a carrier 301 on which a chip card module 302 is located. The chip chard 300 may for example be a contactless chip card (or provide the functionality of a contactless chip card, e.g. in addition to a contact-based chip card). For this, the chip card 300 includes an antenna 305 arranged in the carrier 301 around the chip card module 302 via which the chip card module 302 may communicate but via which the chip card module 302 may also receive its operation power.

The chip card 302 includes a non-volatile memory (NVM) 303 which is in the following example the first clock domain and a microprocessor (e.g. a CPU) 304 which is in the following example the second clock domain and reads data from the NVM 303.

Figure 4:
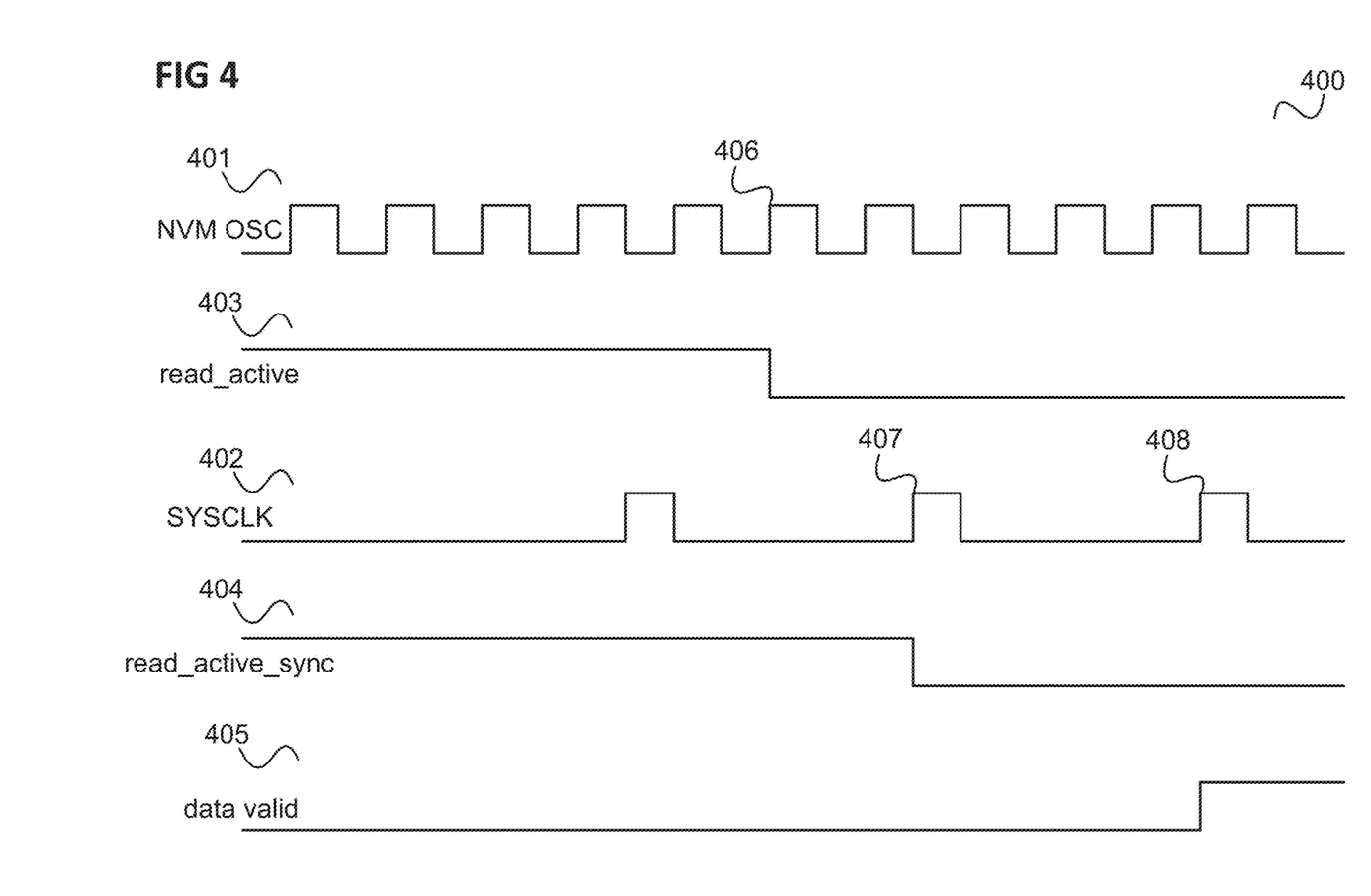
FIG. 4 shows a signal diagram for the chip card of FIG. 3.

FIG. 4 shows a signal diagram 400 illustrating the clock signal NVM OSC 401 of the non-volatile memory 303 and the clock signal SYSCLK of the CPU 304 (e.g. the system clock of the chip card module 301).

Further, the signal diagram 400 shows a handshake signal read_active_nvm 403 generated by the non-volatile memory 303 and a handshake signal read_active_sync 404 which can be seen as the version of the handshake signal generated by the non-volatile memory 303 as adopted by the CPU 304.

Furthermore, the signal diagram 400 shows a data valid signal 405 which indicates (when it is in high state) that the CPU 304 may read data from the non-volatile memory 303 (i.e. that data provided at the output of the non-volatile memory 303 is stable).

The read_active_nvm signal 403 is timed by the NVM clock signal 401, i.e. it changes its state at a rising edge of the NVM clock signal 401, which is e.g. a 300 MHz signal provided by a voltage-controlled oscillator.

The read_active_sync 404 is synchronized with the SYSCLK signal 402, i.e. it changes its state (if it is different from the read_active_nvm signal 403) at a rising edge of the SYSCLK signal 402.

In this example, the NVM 303 switches the read_active_nvm signal 403 to low at a rising edge 406 of the NVM clock signal 401. Thus, the NVM 303 indicates that it is no longer busy reading, i.e. its output can be read.

Accordingly, the read_active_sync 404 becomes low at the next rising edge 407 of the SYSCLK signal 402.

However, to ensure proper timing and for example avoid wrong reading of data when the NVM rising clock edge 406 falls together with the SYSCLK rising clock edge 407 when, e.g. due to a propagation delay in the NVM 303 its output is not yet stable, a SYSCLK wait state is introduced which means that the data valid signal 405 is only switched to high at the second rising clock edge 408 following the first rising clock edge 407 of the system clock after the read_active signal 403 has become low.

However, as it is illustrated in FIG. 4, the frequency of the system clock 402 may be lower than the frequency of the NVM clock 401. This may for example be the case if the amount of energy provided to the chip card 300 (via radio when it operates as contactless chip card) is relatively small and the system frequency is therefore set to a relatively low level. In this case, the SYSCLK wait state i.e. the clock cycle of the SYSCLK 402 that has to expire before the data valid signal 405 is activated may introduce a relatively long delay which is in many cases, as in the example of FIG. 4, unnecessary.

In the following, an embodiment is described in which corruption of data as a result of clock domain crossing is addressed by that the source clock domain requests the destination clock domain to pause (i.e. stop or interrupt) the supply of a clock signal to its input circuit (e.g. input flip-flop), i.e. to pause the clocking of its input circuit, when the output progresses (i.e. switches) from one data element to the next.

Figure 5:
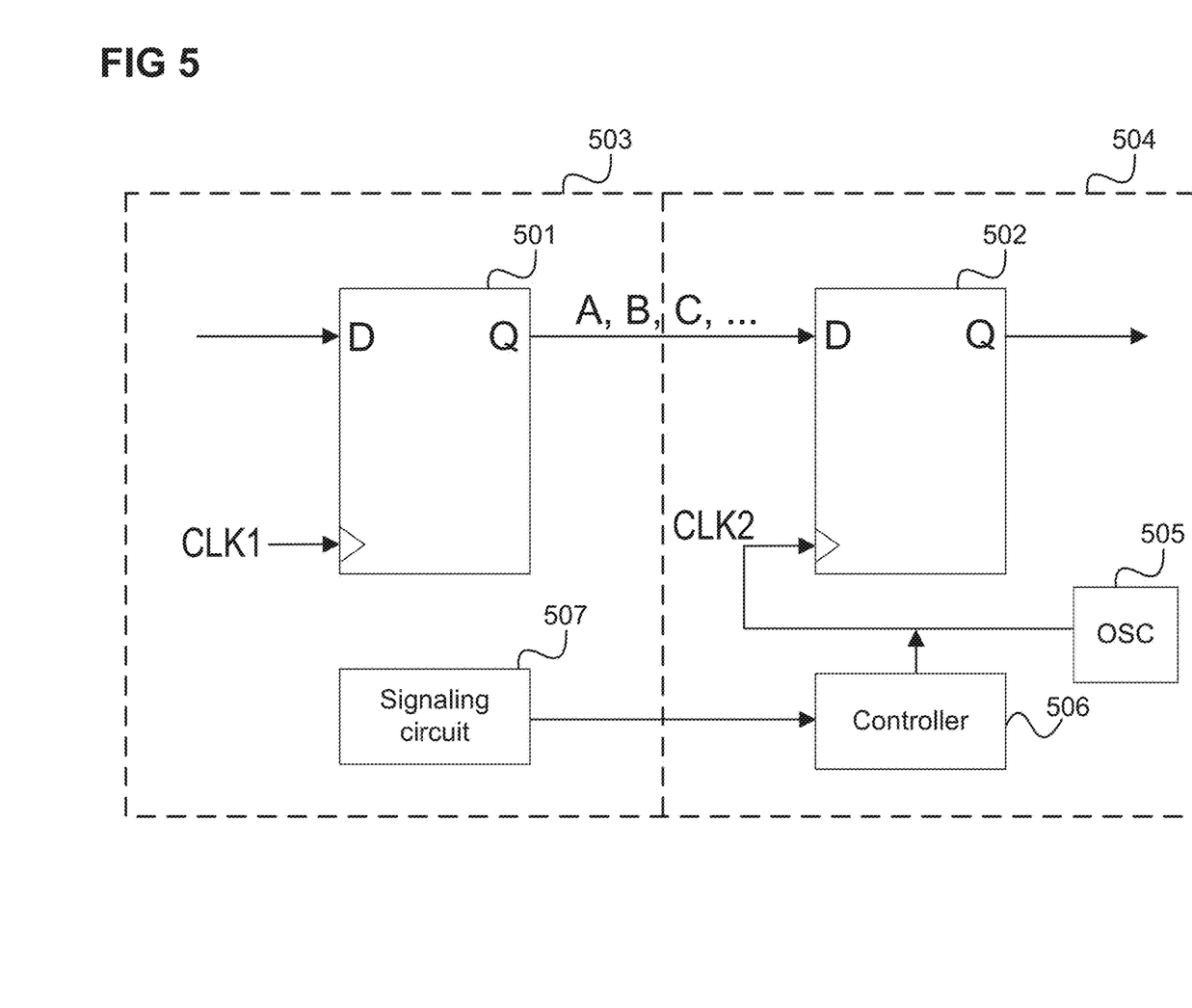
FIG. 5 shows an electronic circuit according to an embodiment.

FIG. 5 shows an electronic circuit 500, which, similarly to FIG. 1, has a first flip-flop 501 of a first clock domain 503 (i.e. an output flip-flop of the source clock domain) and a second flip-flop 502 of a second clock domain 504 (i.e. an input flip-flop of the destination clock domain). As in FIG. 1, the Q output of the first flip-flop 501 is connected to the D input of the second flip-flop 502. The first flip-flop 501 is supplied with a first clock signal CLK1 of the first clock domain 503 and the second flip-flop is supplied with a second clock signal CLK2 of the second clock domain 504. The second clock signal CLK2 is provided by an oscillator 505 and is supplied to the second flip-flop via or at least under the control of a controller 506.

The first clock domain 503 includes a signaling circuit 507 which transmits a clock stop signal to the controller 506 when the a new data element is read into the flip-flop 501 to avoid that the second flip-flop 502 reads in the data element when the first flip-flop 501 has not yet reached a stable state.

In response to the clock stop signal, the controller 506 stops (i.e. interrupts) the clocking of the second flip-flop 502. For example, the controller 506 is a controller of the oscillator 505 and stops the oscillator 505 or deactivates a clock enable signal supplied to the second flip-flop 502 or interrupts a clock signal line from the oscillator 505 to the second flip-flop 502.

Figure 6:
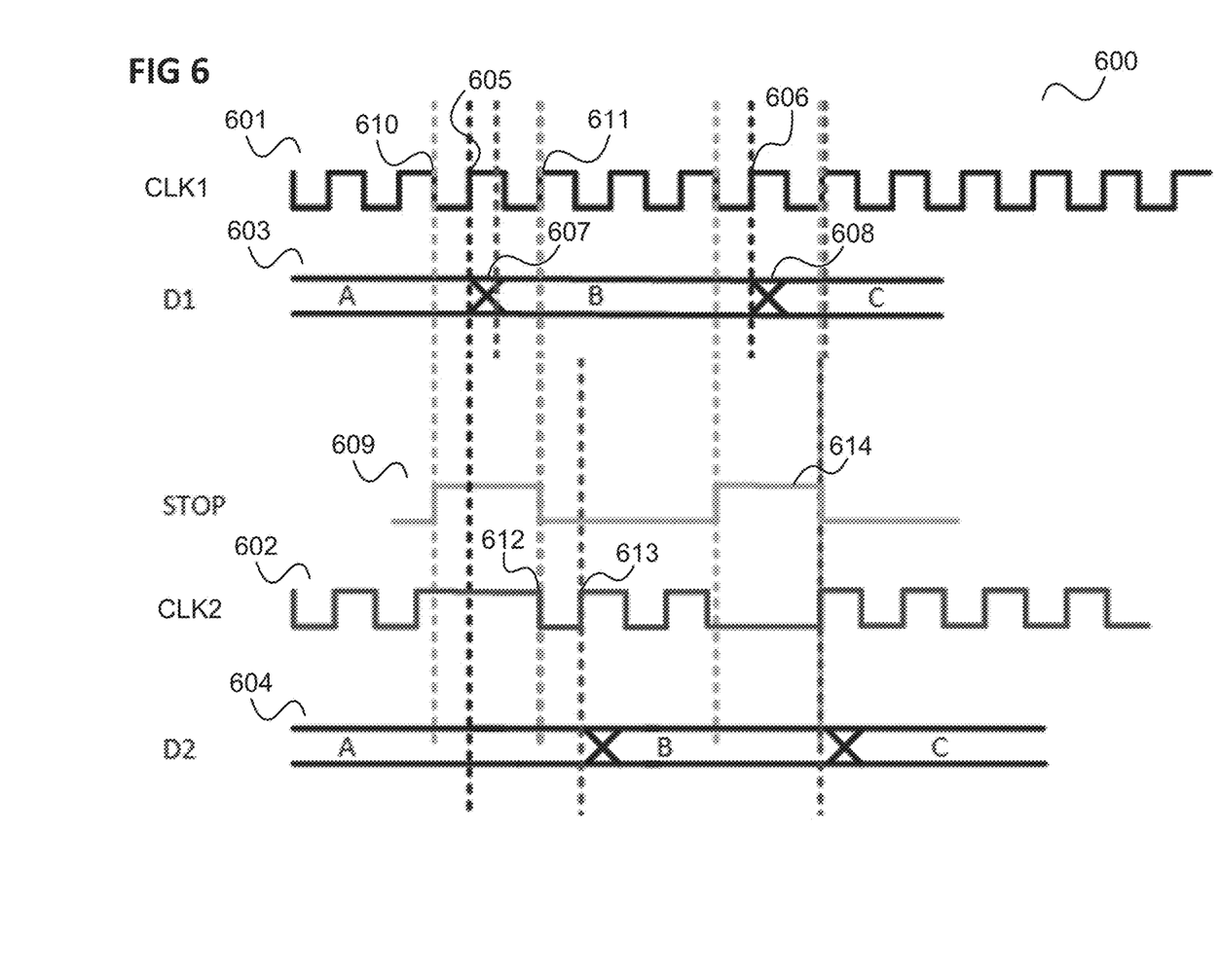
FIG. 6 shows a signal diagram illustrating the operation of the electronic circuit.

FIG. 6 shows a signal diagram 600 illustrating the operation of the electronic circuit 500.

In FIG. 6, a first clock signal CLK1 601, for example corresponding to the first clock signal CLK1 of the first clock domain 503 of FIG. 5, a second clock signal CLK2 602, for example corresponding to the second clock signal CLK2 of the second clock domain 503 of FIG. 5, first data 603 as provided by the first clock domain 503 and a second data 604 as captured by the second clock domain 104 are illustrated.

As in the example of figure, the first clock domain 503 provides a first data element (e.g. a bit) A, until a first rising clock edge 605 of the first clock CLK1, then switches to providing a second data element B until a second rising clock edge 606 of the first clock CLK1 and then switches to providing a third data element C.

Further, as in the example of FIG. 2, the switching from data element A to data element B takes a certain first switching time interval 607 marked by an X, i.e., only after the first switching time interval 607 has passed the data element B is stably provided at the output of the first clock domain 503, i.e. by the first flip-flop 501. Similarly, only after a second switching time interval 608 marked with an X the data element C is stably provided at the output of the first clock domain 503.

In contrast to the example of FIG. 2, where the case occurs that the second clock domain 503 samples the data element output by the first clock domain 504 at a first clock edge 209 of the second clock CLK2 which falls within the first switching time interval 207, this is prevented in this example by a stop signal 609 (also referred to as clock blanking signal) which the signaling circuit 507 supplies to the controller 506 during the data change period, i.e. when the output of the first clock domain 501 is switched to the data element B, in this case starting at a first falling clock edge 610 of the first clock CLK1 (which is the last falling clock edge before the first rising clock edge 605 of the first clock CLK1) until a third rising clock edge 611 of the first CLK1 (which is the first rising clock edge of the first clock after the first switching time interval).

In response to the stop signal 609, i.e. for the time the stop signal 609 is active (high in this example), the controller stops 506 the second clock signal CLK 602 (or at least its supply to the second flip-flop 502) such that, as illustrated, the second clock signal CLK 602 maintains the high state until the third rising clock edge 611 of the first clock CLK1 when the CLK 602 again has a falling edge 612 (which, in this example, occurs at the same time as the third rising clock edge 611 of the first clock CLK1 but may also occur later). Thus, in contrast to FIG. 2, the second clock domain 504 reads out the data output by the first clock domain 503 at a rising clock edge 614 of the second CLK after the first switching time interval 607 and the reading of a wrong value is avoided.

Similarly, the stop signal 609 is active during a time interval 614 including the second switching time interval 608 and the controller stops the second clock signal CLK2 during this time interval 614. However, this has no effect compared to the example of FIG. 2 since the timing of the reading of the output of the first clock domain 503 by the second clock domain 504 stays the same.

Using a clock stop signal as explained above with reference to FIGS. 5 and 6 allows setting aside wait states as described in the example of FIG. 4.

Figure 7:
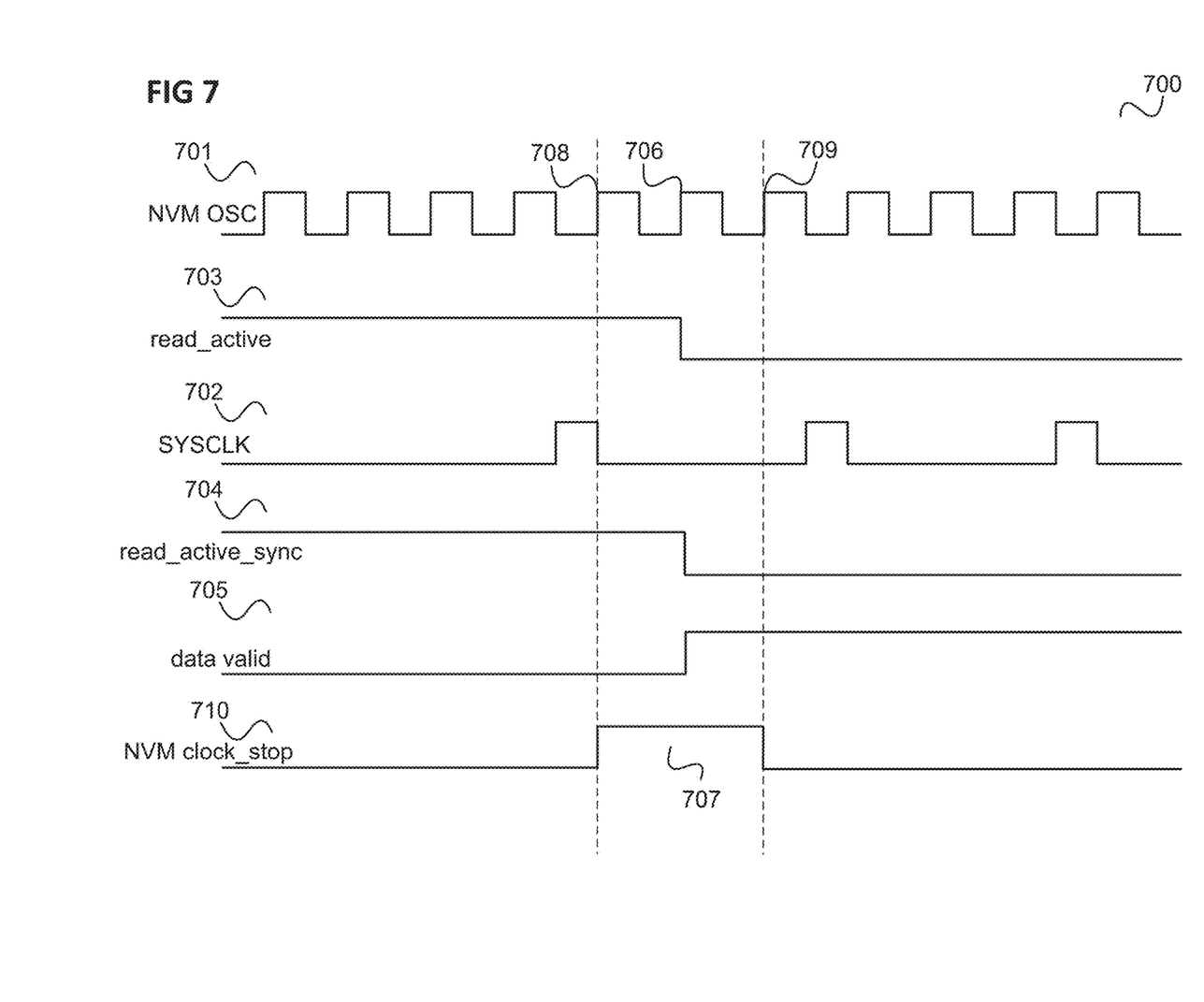
FIG. 7 shows a signal diagram illustrating an application of a clock stop signal for the chip card of FIG. 3.

FIG. 7 shows a signal diagram 700 illustrating an application of a clock stop signal for the chip card 300 of FIG. 3.

Similarly to FIG. 4, the signal diagram 700 shows the clock signal NVM OSC 701 of the non-volatile memory 303 and the clock signal SYSCLK of the CPU 704 (e.g. the system clock of the chip card module 301), as well as a handshake signal read_active_nvm 703 as it is generated by the non-volatile memory 303 and the handshake signal read_active_sync 704 as it is received by the CPU 304 and a data valid signal 705 which indicates (when it is in high state) that the CPU 304 may read data from the non-volatile memory 303 (i.e. that data provided at the output of the non-volatile memory 303 is stable).

In addition, the signal diagram 700 shows a clock stop signal 710, in this case referred to as NVM clock_stop signal.

As in the example of FIG. 4, the read_active signal 703 is timed by the NVM clock signal 701, i.e. it changes its state at a rising edge of the NVM clock signal 701. In contrast to FIG. 4, the read_active_sync signal 704 is not synchronized with the SYSCLK signal 702. This means that when the NVM 303 switches the read_active_nvm signal 703 to low at a first rising edge 706 of the NVM clock signal 701, the read_active_sync signal 704 becomes low immediately when the read_active signal 703 is becoming low.

Furthermore, no wait state is applied. Therefore, the data valid signal 705 becomes high immediately when the read_active_nvm signal 703 is becoming low.

To avoid a possible corruption of data due to timing violation, the non-volatile memory 303 sets the clock stop signal high during a time interval which covers a time range around the time when the read_active_nvm signal 703 becomes low and thus prevents reading errors due to an unfavorable relation between the NVM clock 701 and the system clock 702.

Specifically, the non-volatile memory 303 sets the clock stop signal high (i.e. activates the clock stop signal) one clock period before deactivation of the read_active_nvm signal, in this case at a second rising edge 708 of the NVM clock 701 and sets the clock stop signal low (i.e. deactivates the clock stop signal) one clock period after deactivation of the read_active signal, in this case at a third rising edge 709 of the NVM clock 701.

However, in this case, the system clock 702 would not have a clock edge anyway during the time interval 707 such that the stop signal 710 has no impact on the system clock 702. Still, it ensures that the wait state may be omitted and thus allows speeding up the reading process.

Figure 8:
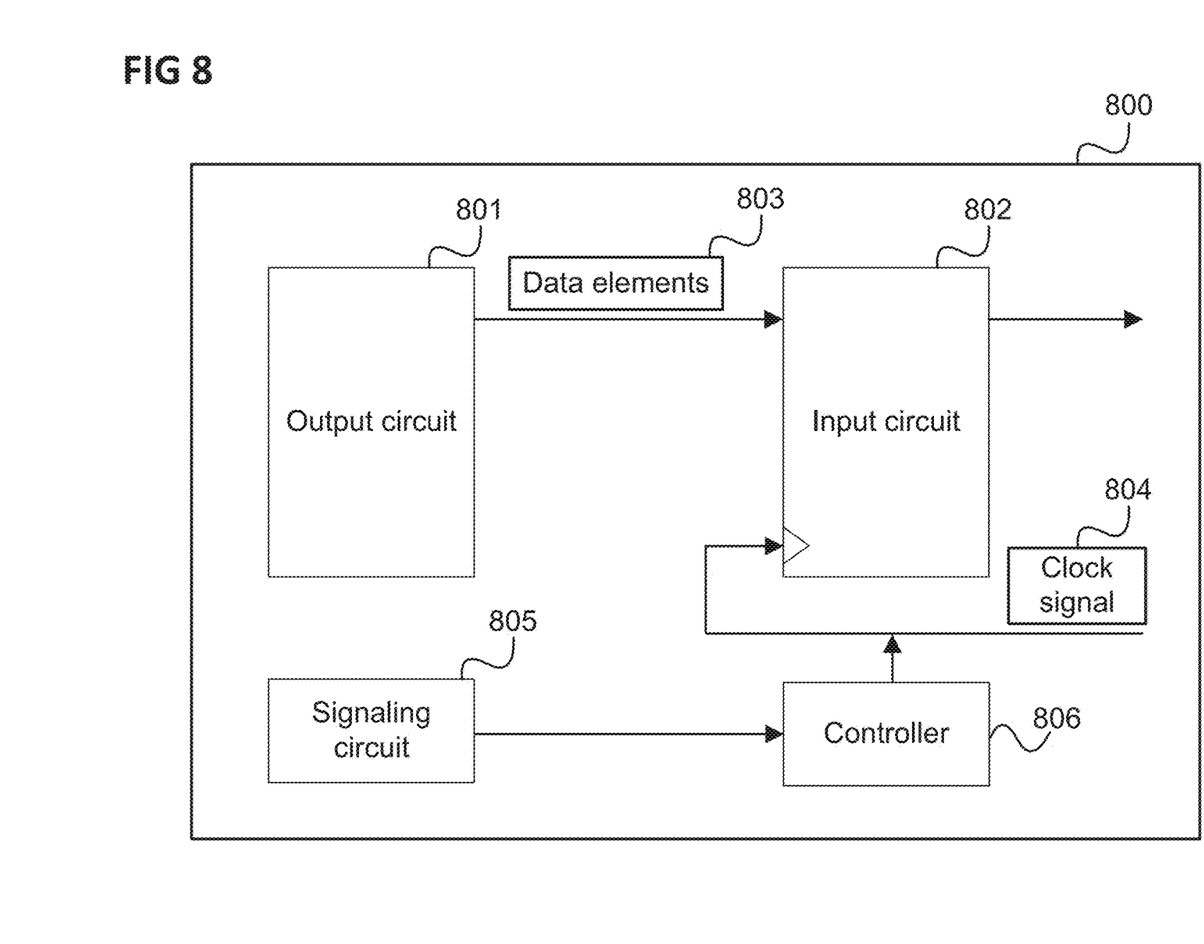
FIG. 8 shows an electronic circuit according to an embodiment.

In summary, according to various embodiments, an electronic circuit is provided as illustrated in FIG. 8.

FIG. 8 shows an electronic circuit 800.

The electronic circuit 800 includes an output circuit 801 configured to output data elements 803 and an input circuit 802 configured to receive the data elements 803 from the output circuit 801 wherein the input circuit 802 is clocked by a clock signal 804 and receives the data elements in accordance with its clocking.

The electronic circuit 800 further includes a signaling circuit 805 configured to, when the output circuit 801 switches from the output of one data element to the output of a following data element, signal to interrupt the clocking of the input circuit 802 and a controller 806 configured to interrupt the clocking of the input circuit in response to the signaling.

In other words, according to one embodiment, two (or also more) asynchronous clock domains are synchronized by stopping the receiver's clock source (or clock supply) while sender's output data is changing. The sender applies a clock stop signal to ensure that no data collisions or violation happen. It should be noted that this can also be applied for analog to digital signal transfers, i.e. for a scenario where the output circuit (or sender circuit) is in an analog domain and the input circuit (or receiver circuit) is in a digital domain.

The time of the signalling to interrupt the clocking of the input circuit when the output circuit switches from the output of one data element to the output of a following data element may be freely chosen, taking into account that the input circuit's clocking should (at least) be interrupted during a time period during which the output circuit's output is not stable, i.e. such that for example the interruption covers the switching time interval of the output circuit (e.g. as described above with reference to FIG. 2).

The approach of FIG. 8 allows performing synchronization with little complexity. It may be implemented without the receiver circuit (input circuit) itself needing any extra signal or state and the sender circuit (output circuit) just blanking the clock of the receiver circuit by stopping a clock source of the receiver circuit.

For memory buses based on analog read outs, e.g. a non-volatile memory, a performance benefit can be achieved since extra wait states are not necessary and critical clock samplings are suppressed by blanking, e.g. the receiver clock is not active during critical data transitions.

For flash products (e.g. code execution from NVM) a performance increase in current limited applications and a general benefit by avoiding wait states and the related current consumption can be achieved.

Figure 9:
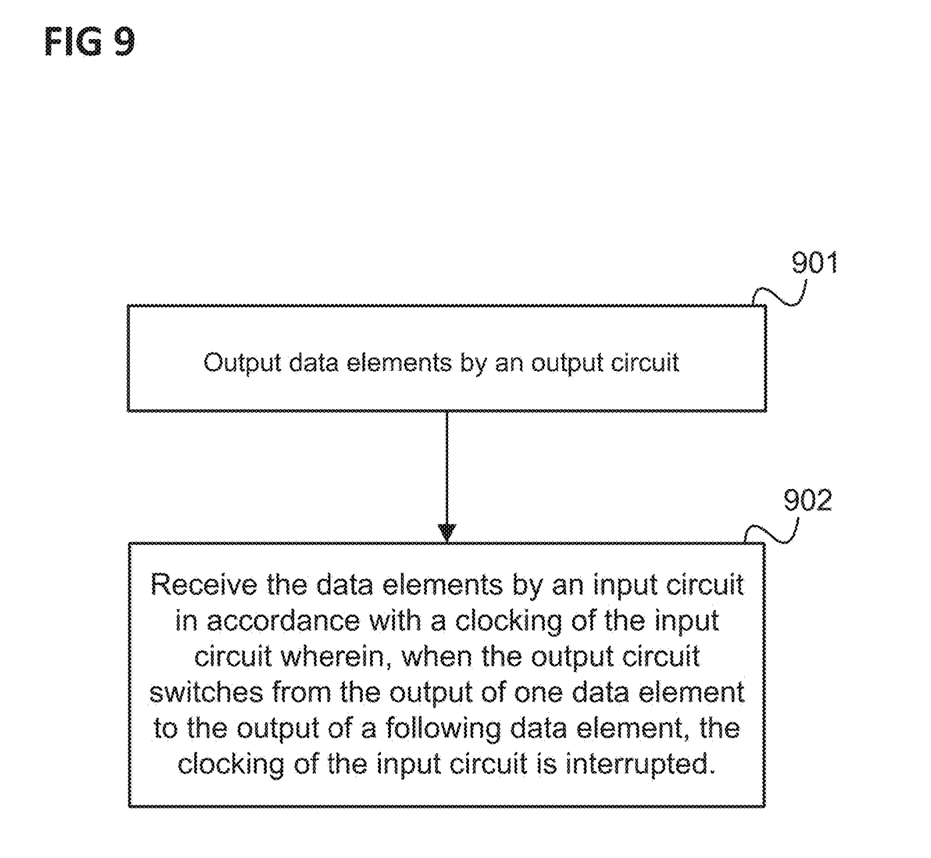
FIG. 9 shows a flow diagram illustrating a method for transferring data according to an embodiment.

According to various embodiments, a method for transferring data as illustrated in FIG. 9 is provided.

FIG. 9 shows a flow diagram 900.

In 901, data elements are output by an output circuit.

In 902, the data elements by an input circuit in accordance with a clocking of the input circuit wherein, when the output circuit switches from the output of one data element to the output of a following data element, the clocking of the input circuit is interrupted.

In the following, further embodiments are described in more detail.

Embodiment 1 is an electronic circuit as illustrated in FIG. 8.

Embodiment 2 is the electronic circuit of embodiment 1, wherein the output circuit operates in a first clock domain or an analog domain and the input circuit operates in a second clock domain.

Embodiment 3 is the electronic circuit of embodiment 1, wherein the output circuit operates in a first clock domain configured to operate according to a first clock signal and the input circuit operates in a second clock domain configured to operate according to a second clock signal, wherein input circuit is clocked by the second clock signal and the first clock signal is different from the second clock signal.

Embodiment 4 is the electronic circuit of any one of embodiments 1 to 3, wherein the input circuit includes a flip-flop having a data input which is coupled to the output circuit via a bit line wherein the clocking of the input circuit includes a clocking of the flip-flop.

Embodiment 5 is the electronic circuit of embodiment 4, wherein the flip-flop is a master-slave flip-flop.

Embodiment 6 is the electronic circuit of embodiment 4 or 5, wherein the output circuit includes a flip-flop having an output coupled to the input of the flip-flop of the input circuit.

Embodiment 7 is the electronic circuit of embodiment 6, wherein each data element is a bit supplied from the flip-flop of the output circuit to the flip-flop of the input circuit.

Embodiment 8 is the electronic circuit of any one of embodiments 1 to 7, wherein each data element is part of a data vector including a plurality of bits supplied from the output circuit to the input circuit in parallel.

Embodiment 9 is the electronic circuit of any one of embodiments 1 to 8, wherein the output circuit and the input circuit are connected via a bus.

Embodiment 10 is the electronic circuit of any one of embodiments 1 to 9, including a clock source configured to supply the clock signal to the input circuit, wherein the controller is configured to stop the generation of the clock signal by the clock source in response to the signaling.

Embodiment 11 is the electronic circuit of embodiment 10, wherein the clock source is an oscillator and the controller is configured to stop the oscillator in response to the signaling.

Embodiment 12 is the electronic circuit of any one of embodiments 1 to 11, wherein the input circuit includes a clock enable input for receiving a clock enable signal and the controller is configured to deactivate the clock enable signal in response to the signaling.

Embodiment 13 is the electronic circuit of any one of embodiments 1 to 12, wherein the controller is configured to interrupt the supply of the clock signal to the input circuit in response to the signaling.

Embodiment 14 is the electronic circuit of any one of embodiments 1 to 13, wherein the input circuit is configured to receive each data element by sampling the data element as output by the output circuit at a sampling time.

Embodiment 15 is the electronic circuit of embodiment 14, wherein the sampling time is a clock edge of the clock signal.

Embodiment 16 is the electronic circuit of any one of embodiments 1 to 15, wherein the output circuit is configured to switch from the output of one data element to the output of a following data element at a switching time and the signaling circuit is configured to signal to interrupt the clocking of the input circuit for the duration of a time interval covering the switching time.

Embodiment 17 is the electronic circuit of embodiment 16, wherein the time interval covers the switching time and a period of metastability of the output of the output circuit.

Embodiment 18 is the electronic circuit of embodiment 16 or 17, wherein the switching time is a clock edge of a clock signal of the output circuit.

Embodiment 19 is the electronic circuit of any one of embodiments 1 to 18, wherein the signaling circuit is configured to signal to interrupt the clocking of the input circuit for the duration of a time interval and the controller is configured to interrupt the clocking of the input circuit for the duration of the time interval in response to the signaling.

Embodiment 20 is the electronic circuit of any one of embodiments 3 to 19, wherein the output circuit operates in and analog domain and the input circuit operates in an analog domain.

Embodiment 21 is a method for transferring data as illustrated in FIG. 9.

It should be noted that embodiments described in context with the electronic circuit 800 are analogously valid for the method illustrated in FIG. 9 and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic circuit, comprising
an output circuit configured to output data elements;
an input circuit configured to receive the data elements from the output circuit wherein the input circuit is clocked by a clock signal and receives the data elements in accordance with its clocking;
a signaling circuit configured to, when the output circuit switches from the output of one data element to the output of a following data element, signal to interrupt the clocking of the input circuit; and
a controller configured to interrupt the clocking of the input circuit in response to the signaling.

2. The electronic circuit of claim 1,
wherein the output circuit operates in a first clock domain or an analog domain and the input circuit operates in a second clock domain.

3. The electronic circuit of claim 1,
wherein the output circuit operates in a first clock domain configured to operate according to a first clock signal and the input circuit operates in a second clock domain configured to operate according to a second clock signal, wherein the input circuit is clocked by the second clock signal and the first clock signal is different from the second clock signal.

4. The electronic circuit of claim 3,
wherein the output circuit operates in an analog domain and the input circuit operates in an analog domain.

5. The electronic circuit of claim 1,
wherein the input circuit comprises a flip-flop having a data input which is coupled to the output circuit via a bit line wherein the clocking of the input circuit comprises a clocking of the flip-flop.

6. The electronic circuit of claim 5,
wherein the flip-flop is a master-slave flip-flop.

7. The electronic circuit of claim 5,
wherein the output circuit comprises a flip-flop having an output coupled to the input of the flip-flop of the input circuit.

8. The electronic circuit of claim 7,
wherein each data element is a bit supplied from the flip-flop of the output circuit to the flip-flop of the input circuit.

9. The electronic circuit of claim 1,
wherein each data element is part of a data vector comprising a plurality of bits supplied from the output circuit to the input circuit in parallel.

10. The electronic circuit of claim 1,
wherein the output circuit and the input circuit are connected via a bus.

11. The electronic circuit of claim 1, further comprising:
a clock source configured to supply the clock signal to the input circuit, wherein the controller is configured to stop a generation of the clock signal by the clock source in response to the signaling.

12. The electronic circuit of claim 11,
wherein the clock source is an oscillator and the controller is configured to stop the oscillator in response to the signaling.

13. The electronic circuit of claim 1,
wherein the input circuit comprises a clock enable input for receiving a clock enable signal and the controller is configured to deactivate the clock enable signal in response to the signaling.

14. The electronic circuit of claim 1,
wherein the controller is configured to interrupt a supply of the clock signal to the input circuit in response to the signaling.

15. The electronic circuit of claim 1,
wherein the input circuit is configured to receive each data element by sampling the data element as output by the output circuit at a sampling time.

16. The electronic circuit of claim 15,
wherein the sampling time is a clock edge of the clock signal.

17. The electronic circuit of claim 1,
wherein the output circuit is configured to switch from the output of one data element to the output of a following data element at a switching time and the signaling circuit is configured to signal to interrupt the clocking of the input circuit for a duration of a time interval covering the switching time.

18. The electronic circuit of claim 17,
wherein the time interval covers the switching time and a period of metastability of the output of the output circuit.

19. The electronic circuit of claim 17,
wherein the switching time is a clock edge of a clock signal of the output circuit.

20. The electronic circuit of claim 1,
wherein the signaling circuit is configured to signal to interrupt the clocking of the input circuit for a duration of a time interval and the controller is configured to interrupt the clocking of the input circuit for the duration of the time interval in response to the signaling.

21. A method for transferring data comprising outputting data elements by an output circuit;
receiving the data elements from the output circuit by an input circuit in accordance with a clocking of the input circuit;
signaling to interrupt the clocking of the input circuit when the output circuit switches from the output of one data element to the output of a following data element; and
interrupting the clocking of the input circuit in response to the signaling.

* * * * *